United States Patent
Golder et al.

(10) Patent No.: US 6,937,945 B2
(45) Date of Patent: Aug. 30, 2005

(54) ELECTRICAL POWER TRANSMISSION

(75) Inventors: Alexander Golder, Glasgow (GB); Douglas Harman Wilson, Edinburgh (GB)

(73) Assignee: Paymetrix Limited (GB)

(*) Notice: Subject to any disclaimer, the term of this patent is extended or adjusted under 35 U.S.C. 154(b) by 0 days.

(21) Appl. No.: 10/740,870

(22) Filed: Dec. 19, 2003

(65) Prior Publication Data

US 2004/0186671 A1 Sep. 23, 2004

Related U.S. Application Data

(63) Continuation of application No. PCT/GB02/02690, filed on Jun. 14, 2002.

(30) Foreign Application Priority Data

Jun. 22, 2001 (GB) ............................................. 0115283
Aug. 9, 2001 (GB) ............................................. 0119398
Aug. 9, 2001 (GB) ............................................. 0119400

(51) Int. Cl.[7] ............................................... G06F 3/05
(52) U.S. Cl. ............................ 702/60; 702/58; 702/64; 702/67
(58) Field of Search .......................... 702/58, 60, 182, 702/64, 67, 75, 179–181, 117, 188; 323/282; 363/81; 714/3, 4

(56) References Cited

U.S. PATENT DOCUMENTS

| | | | |
|---|---|---|---|
| 5,566,085 A | 10/1996 | Marceau et al. | 364/492 |
| 5,638,297 A | 6/1997 | Mansour et al. | 364/495 |
| 5,754,035 A * | 5/1998 | Sen | 323/207 |
| 5,818,126 A * | 10/1998 | Mohan | 307/85 |
| 2003/0051026 A1 * | 3/2003 | Carter et al. | 709/224 |

FOREIGN PATENT DOCUMENTS

WO   WO 03/001645 A3   1/2003

OTHER PUBLICATIONS

C.D. Schauder et al., Operation of the Unified Power Flow Controller (UPFC) Under Practical Constraints, Apr. 1998, IEEE Transmission on Power Delivery, vol. 13, pp. 630–639.*

L. Gyugyi et al., The Interline Power Flow Controller Concept: A new Approach to Power Flow Management in Transmission Systems, Jul. 1999, IEEE Transactions on Power Delivery, vol. 14, pp. 115–1123.*

Marceau, Richard J. et al. "Fourier methods for estimating power system stability limits." *Power Industry Computer Application Conference Proceedings* pp. 418–425 (May 1993).

* cited by examiner

Primary Examiner—Marc S. Hoff
Assistant Examiner—Felix Suarez
(74) Attorney, Agent, or Firm—Lahive & Cockfield LLP; John D. Lanza, Esq.

(57) ABSTRACT

A method of monitoring a high voltage electrical power system is described in which a system acquires measurements the small perturbations in power system parameters, from which are derived the system dynamic characteristics used to determine power transfer limits that take account of power system prevailing conditions. Further, a method is described that can be used to identify the probable source of power system oscillations that can limit secure power transfer.

13 Claims, 5 Drawing Sheets

ELECTRICAL POWER TRANSMISSION

RELATED APPLICATIONS

This application is a continuation of International Application No. PCT/GB02/02690, filed Jun. 14, 2002, which claims priority to Great Britain Patent Application No.: 0115283.4, filed on Jun. 22, 2001, and so to Great Britain Patent Application No.: 0119398.6, filed on Aug. 9, 2001 and also to Great Britain Patent Application No. 0119400.0, filed on Aug. 9, 2001, the contents of each of which are incorporated by reference herein.

FIELD OF THE INVENTION

This invention relates to electrical power transmission systems and particularly to high voltage, high power grid systems.

BACKGROUND OF THE INVENTION

Assuming no thermal limitations, power transfer limits for a power system frequently arise from concerns about transient instability or voltage instability in the event of a contingency. There are also concerns regarding steady-state instability. In order to quantify these potential instabilities a knowledge of the power system's dynamic characteristics is necessary. Existing techniques used to provide estimates of a power system's dynamic characteristics, and hence power transfer limits, are based on mathematical dynamic modelling studies which are subject to significant uncertainties. Hitherto system engineers have had to build in large factors of safety, effectively discounting the safe power transfer capacity by a considerable margin, and thus unduly limiting the power which can be transferred or requiring excess investment in capacity.

It has previously been proposed to use a "signal energy" approach to the setting of power transfer limits, based on the observation that "signal energy" increases (and damping deteriorates) asymptotically as the power flow increases.

However, these proposals suffer from the facts that:
(a) they rely solely on mathematical dynamic modelling, with the attendant problems discussed above
(b) the use of "signal energy" without splitting this quantity into frequency components obscures the nature of the problem
(c) the relationship between signal energy and/or damping and MW power flow is not, in practice, at all uniform.

SUMMARY OF THE INVENTION

According to the present invention there is provided a method of monitoring a high voltage electrical power system comprising the steps of:
deriving measurements of the small signal dynamic characteristics of the power system, wherein the measurements are obtained under the prevailing system conditions, said system conditions being defined by the operational parameters of the power system; and
determining the power transfer limits of the power system utilising said measurement.

As is well known, grid systems are continuously subject to small perturbations. The present invention provides a method of determining power transfer limits in an electrical power transmission system, comprising:
(a) measuring the dynamic characteristics (including mode damping) of the power system based on measurement of the small perturbations, on at least some lines of the system over a period of time;
(b) measuring the power system operational parameters, including power flows, during said period of time;
(c) using the data collected in (a) and (b) to establish relationships between mode damping characteristics and power system operational parameters in each of said lines; and
(d) calculating from said relationship power flow limits, providing the required level of confidence in the security of supply, for each line.

Step (d) is preferably carried out by multivariate analysis of data from a number of points on the system, to identify fixed power system operational parameters/damping relationships and to deal with otherwise unexplained random variations in the relationships.

BRIEF DESCRIPTION OF THE DRAWINGS

Embodiments of the invention will now be described, by way of example only, with reference to the accompanying drawings, in which.

DETAILED DESCRIPTION OF THE INVENTION

The method of the invention involves measuring the small signal or steady state dynamic characteristics of the power system. The measurements are obtained continuously and online and are made and associated with the actual prevailing system conditions.

Specifically, the dynamic characteristics which are measured are the mode damping, mode frequency and mode amplitude of the system based on real or reactive power flow, voltage, system frequency, etc.

These mode values are in turn associated with the actual prevailing system parameters such as real and reactive power, voltage, system frequency etc.

In addition, the time of occurrence of the measurements is always taken. These measurements are then used to determine the small signal power transfer limits of the system and thus ensure the most efficient power transfer operational conditions.

Preferably the measurements are modified by a factor which is determined as follows:

As a first stage a series of small signal dynamic characteristic values, preferably the mode damping characteristics, and corresponding operational parameters of the power system are obtained from a mathematical model of the system prior to a limiting transient or voltage condition resulting from an identified contingency event.

From this series of values there is derived a relationship between the small signal dynamic characteristic and the transient limit under the particular system conditions. This relationship is then used together with the actual online small signal measurements to determine the power transfer limits of the system.

The technique can provide on-line information as to how close a power system is to its transfer limit.

The damping characteristics may be measured in terms of damping ratio, mode decay time, or any other suitable form.

The invention further includes deriving the safe limits calculated by the foregoing process to one or more contingency conditions.

The invention is based on making use of actual past data of power system operational parameters and mode damping in the system of interest. Such data may be derived from historic data manually or by other known means.

(a) It is preferable to utilise a power system dynamic model which has been verified by continuous direct dynamics measurements under observable operational conditions so that the required level of confidence can be placed in the model predictions.

On-line estimates of power system dynamics are derived in terms of mode frequency, amplitude and damping by acquiring power system operational parameters at one or more points on a network and analysing the small perturbations that are always present.

A number of features can be noted from this data.

Figure 3:
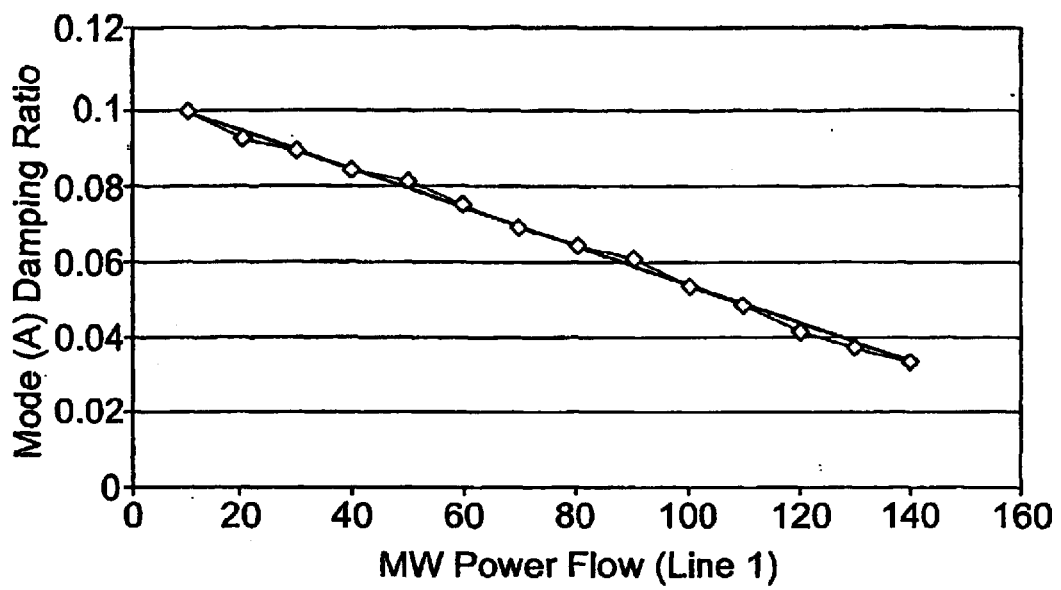
Figure 4:
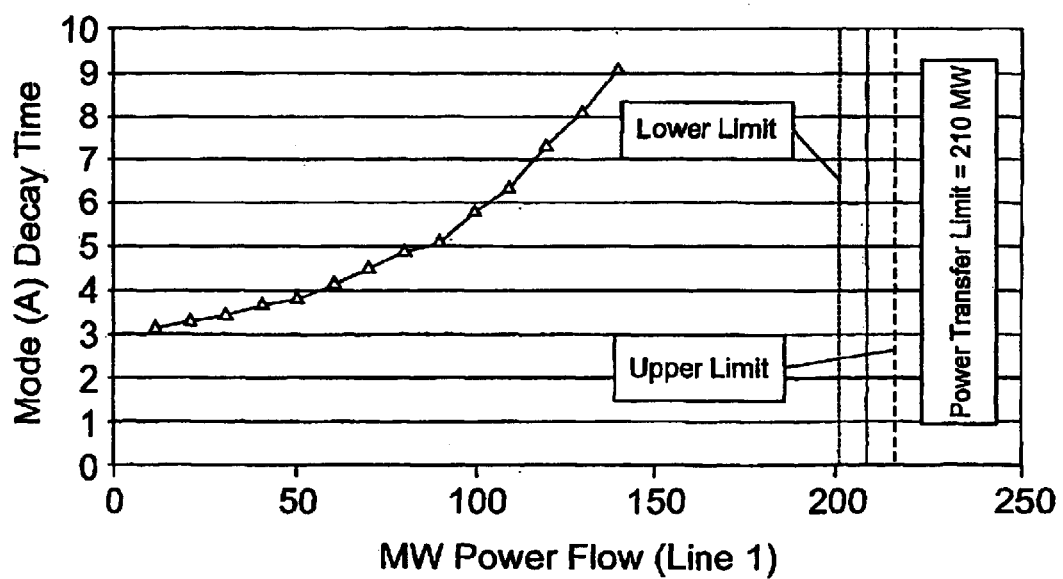
FIG. 4 is a graph illustrating the relationship between power flow and mode decay time.

For example, when the real power flow on a line increases, the mode damping on the line deteriorates. Also, in many instances the mode damping ratio is approximately linearly related to the MW power flow on the line being monitored. For example, in FIG. 3, the relationship between the power flow and the mode damping ratios is Damping Ratio=0.105−0.0005×Power Flow The small signal power transfer limit is established as the point where the damping ratio is zero, i.e. the power flow is 0.105/0.0005=210 MW.

Figure 1:
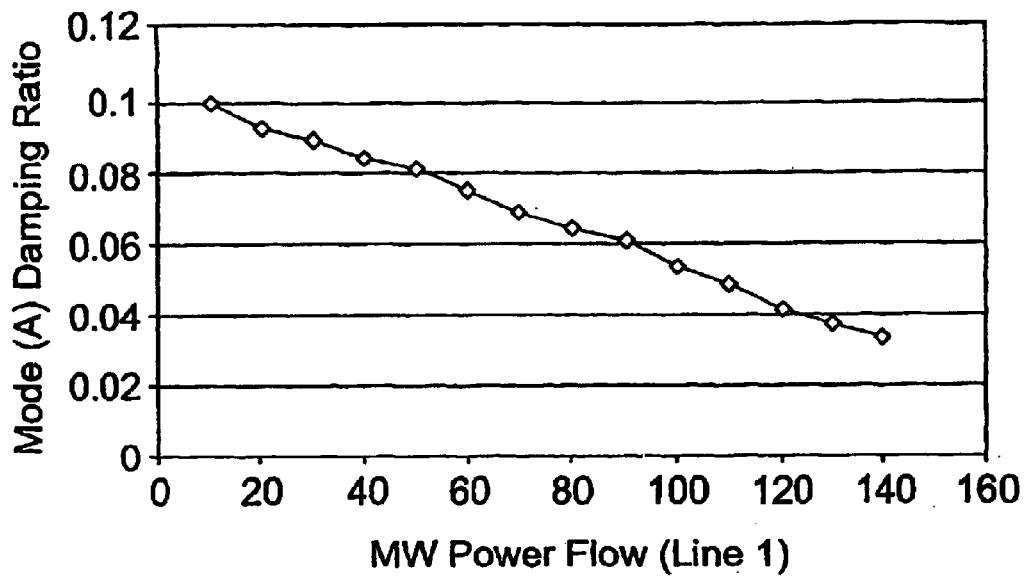
FIGS. 1, 2 and 3 are graphs illustrating the relationship between power flow and mode damping ratio.
Figure 2:
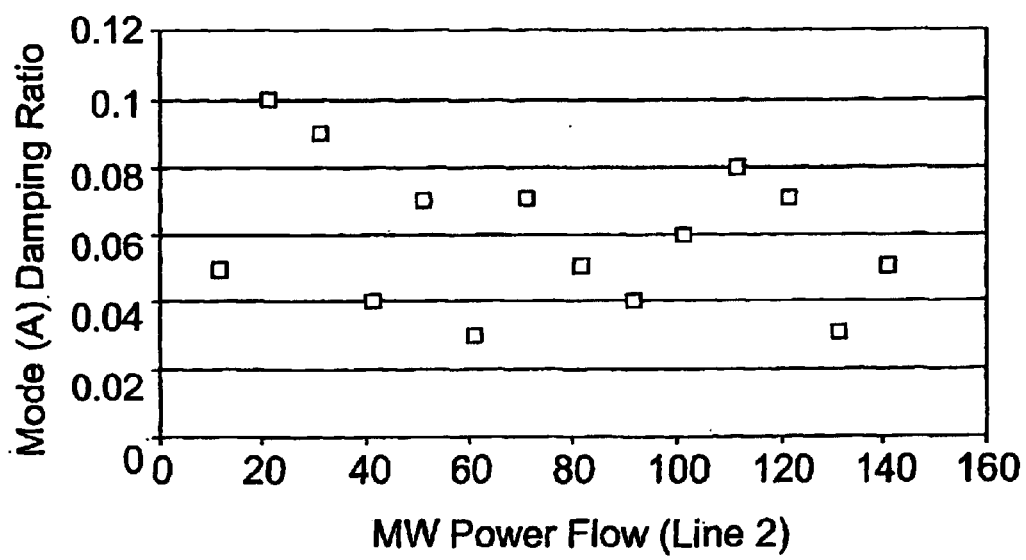

However, this situation does not always pertain. Suppose that two lines in a network are being monitored (Line 1 and Line 2) and that there are two modes present on these lines (Mode A and Mode B). On Line 1, the damping for Mode A is related to the real power flow on Line 1 as shown in FIG. 1. However, on Line 2 it may be that the damping ratio for Mode A is totally unrelated to the real power flow in Line 2 as shown in FIG. 2. At the same time, the damping ratio for Mode B may be approximately linearly related to the real power flow in Line 1 and in Line 2.

At first sight it might appear that there is not a clear relationship between damping and real power flow.

To resolve this problem, it is necessary to recognize that the apparent lack of relationship arises because the situation is being viewed as a univariate problem, whereas it is in fact a multivariate problem. In establishing the relationship between the damping for a mode and the MW power flow on a line, account must be taken of the simultaneous power flow and possibly damping on other associated lines.

By use of multivariate analysis (or neural network as appropriate), one can establish for each line in the system which modes have a fixed relationship between power system operational parameters and mode damping ratio. This can be done, for example, by forming a matrix of observations, from which can be derived the parameters for the multivariate relationships. The fixed multivariate relationships can then be used as discussed above to calculate power transfer limits for each line.

Another source of 'unexplained' variation in the relationship between damping and MW power flow on a line was recognised to arise from inefficient or mal-operating control systems associated with individual generators and plant.

As an additional benefit it is possible to identify which observed generators/plant are contributing to system damping, by including observations on the power system operational parameters associated with individual generators and other associated plant, when establishing the multivariate relationship.

It should be noted that the transfer limits derived in this way apply to both voltage and transient instability; in this way the likelihood of whether the power system can withstand any specific contingency can be estimated.

It is important to realise that this assessment is based largely on observational data, and the only network modelling involved is required in order to derive relationships between pre-contingency small signal dynamic characteristics and transient limits.

Another important feature of the technique is that by basing transfer limits on the prevailing power system dynamic conditions, 'conditional' rather than 'marginal' probabilities are being used and this fact leads to additional accuracy and flexibility in the assessment of transfer limits.

In another aspect there are frequent incidents in high voltage transmission systems where a poorly damped oscillation 'spontaneously' appears in the power flow on a transmission line. These oscillations can be sustained for a few minutes or extend to several hours. During the time when these poorly damped oscillation are present, the power system is being exposed to a power system supply security risk, that usually takes the form of a voltage or transient instability risk. The source of the oscillations is often related to the maloperation of the control systems associated with electrical generators or other plant connected to the transmission system.

There are many generators and other plant items connected to a transmission system and it is currently very difficult to identify from among these many items, which individual item of plant is at fault. When the individual plant item is identified, corrective action can be taken and so reduce the risk of loss of supply.

The present invention also provides a means of identifying the individual plant item based on the modal analysis of measurements of voltage, current, real power flow, reactive power flow and system frequency taken from the power system.

The dynamic characteristics for the power system are measured, in terms of mode frequency, mode damping and mode amplitude. By comparing some or all of these modal measurements between the various measurement locations on the network, identification of the location of the source of the poor damping is made possible. Hitherto, it has been traditionally assumed that the frequency and damping for a mode is constant across the transmission network, with only mode amplitude varying from one location to another (i.e. that the power system behaves in a linear manner in this respect).

Where modal analysis is done on signals acquired close to individual plant, this non-linear behaviour of the power system can be utilised to identify individual maloperating plant.

Another aspect whereby detection of the source of an oscillation is made possible is by means of examining the phase relationship for modes associated with power system frequency and real (or reactive) power. Where the source of an oscillation is in close proximity to the point of measurement, a greater difference in phase between modes can be expected than the case where the point of measurement is remote from the oscillation source.

Figure 6:
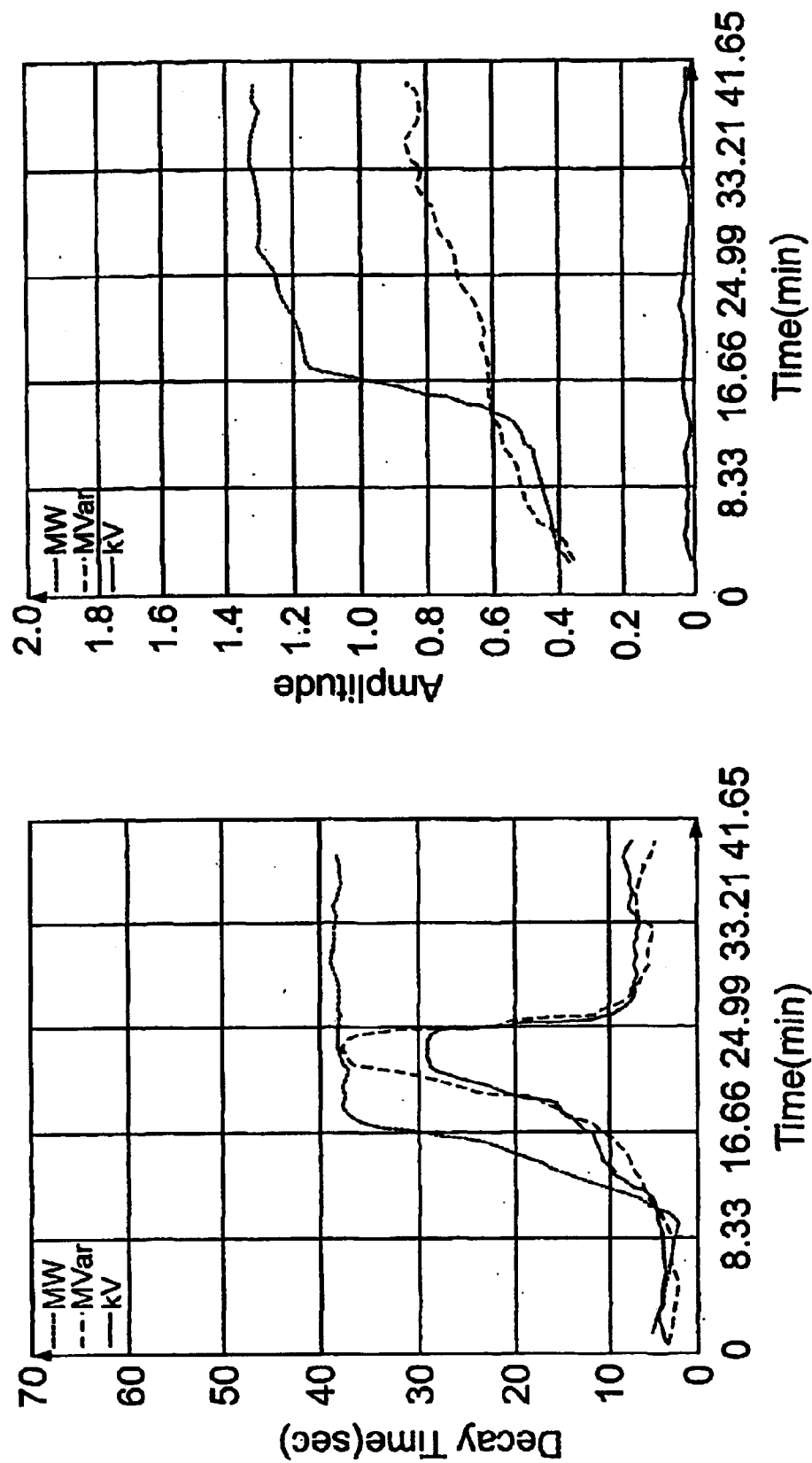
Figure 7:
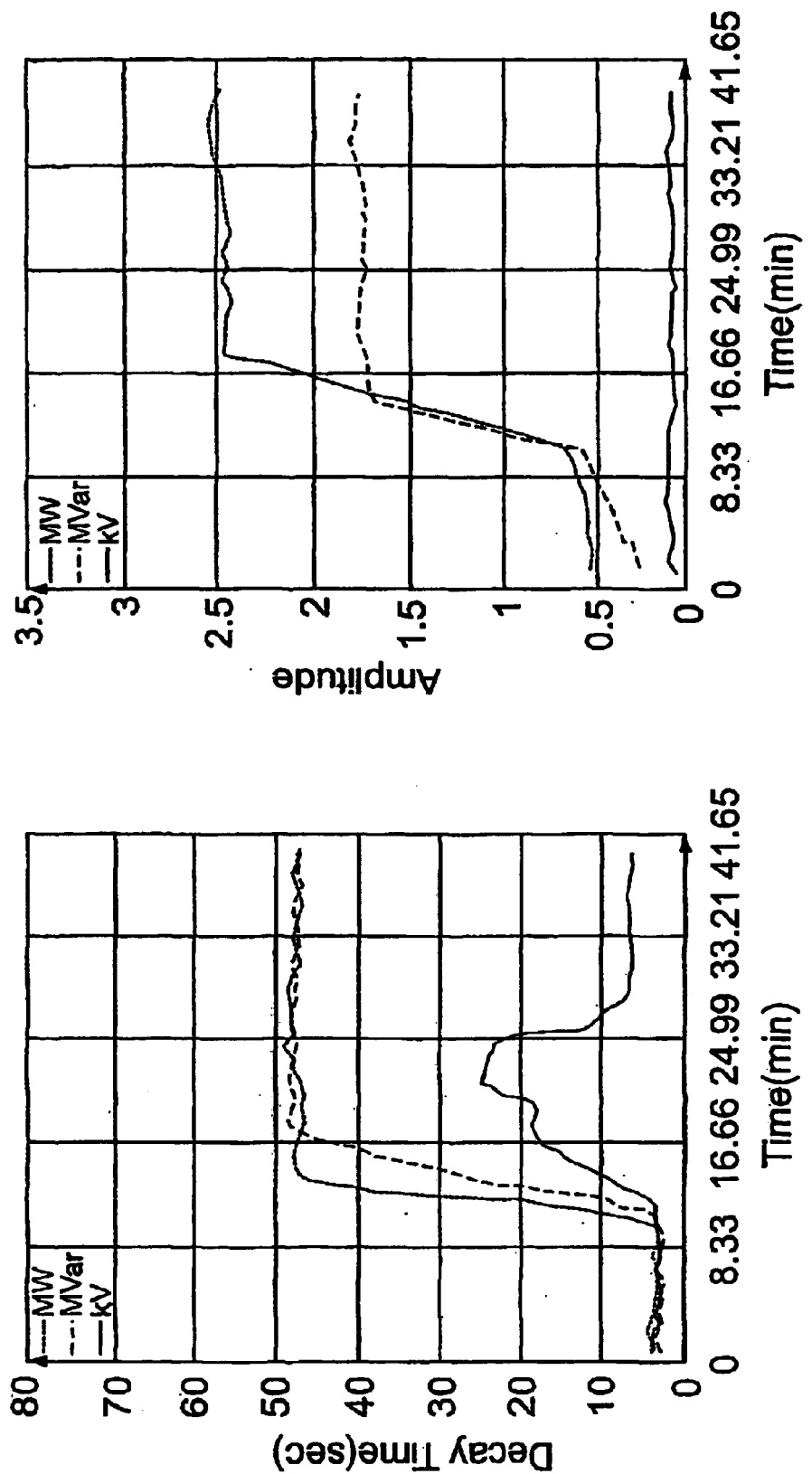

An example of the use of this aspect of the invention will now be described with reference to FIGS. 5 to 7.

Figure 5:
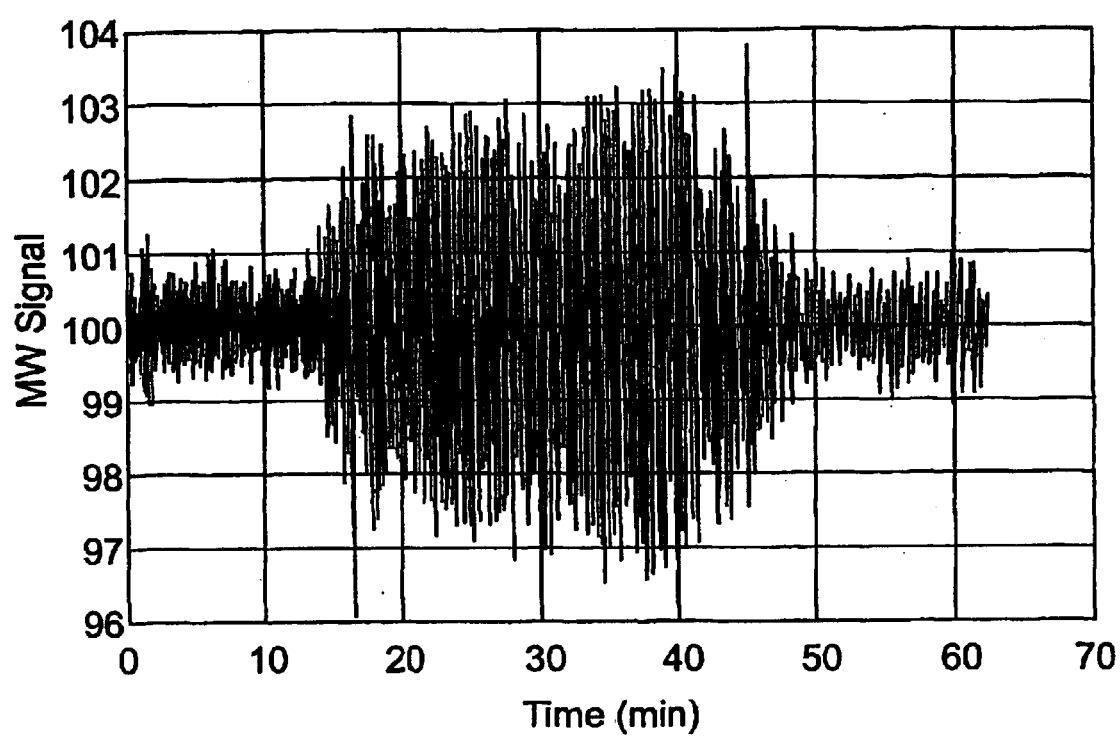
FIGS. 5 to 7 are graphs relating to a further embodiment.

FIG. 5 illustrates a 'spontaneous' oscillation typical of what can often be seen on transmission systems. FIG. 6 illustrates the results obtained when the real power, reactive power and voltage signals for this event are analysed at point A on the transmission network that is electrically remote from the source of the oscillation. FIG. 7 illustrates the results obtained when the real power, reactive power and voltage signals for this event when analysed at point B in the transmission network that is electrically close to the source of the oscillation.

It can be seen in this illustration that the mode decay time constant for the reactive power signal at point B:

(a) has a higher level in terms of average and maximum value over the period of the oscillation
(b) achieves a high value at a point in time that is in advance of the corresponding signal at point A It can also be seen that the average and maximum values achieved for the real power and voltage signals during the period of the oscillation are generally higher at point B than at point A.

These and other similar indications in the modal analysis results for the various signals, identify that the source of the oscillation lies closer to point B on the network than point A. Taking similar measurements at other points on the network that are more electrically remote from point B, confirms that the source of the oscillation lies close to point B.

By this means the source of the oscillation has now been localised/identified and corrective action can now be targeted on the individual plant, thus removing this risk of loss of supply.

The exact form of the manifestation of a fault within the various signals, depends upon the type of plant fault or maloperation. The precise nature of the manifestation may well be used to classify the fault and provide guidance for the form of remedial action that should be taken.

Modifications and improvements may be made within the scope of the present invention.

What is claimed is:

1. A method of determining power transfer limits in an electrical power transmission system including a plurality of power lines, comprising:
   (a) deriving mode dynamic characteristics on a selection of the lines from measurement of small perturbations in power system operational parameters on said lines over a period of time;
   (b) measuring the power system operational parameters on some or all of the said lines over said period of time;
   (c) using the data collected in (a) and (b) to establish fixed relationships between the dynamic characteristics and the operational parameters in each of said lines; and
   (d) calculating from each of said relationships the power transfer limit for each line.

2. A method as claimed in claim 1 wherein the dynamic characteristics include the mode damping, mode frequency or mode amplitude of the system.

3. A method as claimed in claim 1 wherein the derived dynamic characteristics and corresponding operational parameters are obtained from a mathematical model representing the electrical power transmission system prior to a limiting transient or voltage condition.

4. A method as claimed in claim 2 wherein the mathematical model also represents the electrical power transmission system subsequent to a limiting transient or voltage condition.

5. A method as claimed in claim 1 wherein step (c) further comprises establishing fixed relationships using multivariate analysis by forming a matrix of observations, from which can be derived the parameters for the multivariate relationships.

6. A method as claimed in claim 1 wherein step (c) further comprises establishing fixed relationships using neural networks.

7. A method as claimed in claim 1, wherein the method includes measuring the small perturbations at one or more points in the system on one or more of the following:
   voltage phasors, current phasors, voltage phasor angle difference, current phasor angle difference, real power values, reactive power values, voltage values, current values, system frequency, time of occurrence of values.

8. A method as claimed in claim 1, wherein the measured dynamic characteristics are associated with prevailing system conditions.

9. A method as claimed in claim 1, wherein the measurements are carried out at predetermined intervals.

10. A method as claimed in claim 1, wherein the measurements are carried out substantially continuously.

11. A method of identifying the source of an oscillation in an electrical power transmission system, comprising:
    (a) deriving one or more of the mode damping, mode amplitude and mode frequency from measurements of the real power, reactive power, voltage, current or frequency signals at first and second points in the system;
    (b) comparing the mode damping, mode amplitude or mode frequency of the signals to determine whether the oscillation source is closer to the first point or the second point; and
    (c) repeating steps (a) and (b) until the source is identified.

12. A method as claimed in claim 11 wherein step (b) further comprises comparing the mode phase relationship between points to determine whether the oscillation source is closer to the first point or the second point.

13. A method of determining power transfer limits in an electrical power transmission system including a plurality of power lines, comprising:
    (a) deriving mode damping values on a selection of the lines by measuring small perturbations on said lines over a period of time;
    (b) measuring the power flow on the said lines over said period of time;
    (c) using the data collected in (a) and (b) to establish fixed relationships between the mode damping values and the power flow in each of said lines; and
    (d) calculating from each of said relationships the power transfer limit for each line.

* * * * *